(12) United States Patent (10) Patent No.: US 6,586,989 B2
Perner et al. (45) Date of Patent: Jul. 1, 2003

(54) NONLINEAR DIGITAL DIFFERENTIAL AMPLIFIER OFFSET CALIBRATION

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/005,456

(22) Filed: Nov. 6, 2001

(65) Prior Publication Data

US 2003/0085758 A1 May 8, 2003

(51) Int. Cl.[7] .................................................. H03F 1/02
(52) U.S. Cl. ................................ 330/9; 330/2; 330/253
(58) Field of Search ............................. 330/2, 9, 253, 330/257

(56) References Cited

U.S. PATENT DOCUMENTS 5,214,680 A * 5/1993 Gutierrez, Jr. et al. ........ 377/20
5,933,858 A * 8/1999 Duval ......................... 711/211
6,259,644 B1   7/2001 Tran et al.
6,262,625 B1 * 7/2001 Perner et al. .................. 330/2

* cited by examiner

Primary Examiner—Henry Choe

(57) ABSTRACT

Circuits and methods for calibrating offset error in a differential amplifier in an efficient and reliable way are described. A final calibrated state for the differential amplifier is obtained in accordance with a nonlinear search that requires significantly fewer test stages to complete than linear search methods. As a result, longer test periods may be used with the invention without adversely affecting the overall length of the calibration process. Because circuit conditions near the calibration point cause internal test signals to switch more slowly from one state to another, lengthening the test period time may allow more time for the internal test signals to reach their final values and, thereby, improve calibration accuracy.

20 Claims, 9 Drawing Sheets

NONLINEAR DIGITAL DIFFERENTIAL AMPLIFIER OFFSET CALIBRATION

TECHNICAL FIELD

This invention relates to systems and methods for calibrating offsets in differential amplifiers.

BACKGROUND

In general, differential amplifiers are configured to amplify the difference of two signals applied to a pair of differential input terminals to produce an output signal. An offset signal often must be applied across the differential input terminals of a differential amplifier in order to reduce the output signal to zero. The source of offset error may arise from the physical design of the differential amplifier or it may arise from process variations. Circuit thresholds, the mismatch of device sizes, and circuit operating conditions are all sources of offset error. Many different analog techniques for calibrating differential amplifier offset error have been proposed. One analog technique involves correct transistor sizing and careful physical layout to minimize the basic offset parameters. Even with an optimal design, however, offset correction by design alone often does not sufficiently control the offset voltage for many differential amplifier applications.

Another analog calibration technique involves the use of a switched capacitor circuit for correcting offset error. A typical switched capacitor circuit uses a high gain differential amplifier with a large offset correction capacitor for sampling and holding offset correction data. Typically, a relatively large offset correction capacitor is used to minimize leakage and decay effects. Fabrication of such a large capacitor, however, involves special integrated circuit process steps and a considerable amount of circuit area. In addition, a very high refresh rate is needed to hold the offset voltage to within typical device specifications (e.g., tens of microvolts).

Other techniques for controlling offset errors in differential amplifiers involve analog controlled offset calibration. In general, these analog techniques typically use special analog circuitry to generate analog control signals. Additional circuits are used to sample and store the analog control signals. Normal circuit leakage currents result in analog control signal data being refreshed frequently. Typically, these analog control techniques are subject to the same sample and hold limitations as switched capacitor techniques.

Still other differential amplifier offset calibration techniques have been proposed.

SUMMARY

The invention features a circuit and a method for calibrating offset error in a differential amplifier in an efficient and reliable way. In particular, the invention obtains a final calibrated state for the differential amplifier in accordance with a nonlinear search method that requires significantly fewer test stages to complete than linear search methods. As a result, longer test periods may be used with the invention without adversely affecting the overall length of the calibration process. Because circuit conditions near the calibration point cause internal test signals to switch more slowly from one state to another, lengthening the test period time may allow more time for the internal test signals to reach their final values and, thereby, improve calibration accuracy.

In one aspect, the invention features a calibration circuit that comprises a memory circuit, an output circuit, and a control circuit. The memory circuit is operable to store a set of programming values that are selected from a range of multiple possible sets of programming values. The output circuit is coupled to the memory circuit and is operable to place the differential amplifier in a selected calibrated state by applying to the differential amplifier an output calibration signal that is generated based upon the set of programming values that are stored in the memory circuit. The control circuit is coupled to the memory circuit and is operable to program the memory circuit with a final set of programming values by progressively narrowing the range of possible programming value sets until the final set of programming values is obtained. The range of possible programming value sets is progressively narrowed in test stages in accordance with a nonlinear search. At each test stage, a set of programming values is selected based upon a sensed differential amplifier signal that is generated in response to a test signal that is applied to the differential amplifier in a selected calibrated state.

Embodiments of the invention may include one or more of the following features.

The memory circuit preferably comprises a set of calibration registers. Each calibration register may be gated by a set of global select signals. Each calibration register also may be settable and re-settable.

The output circuit preferably comprises a coarse calibration circuit and a fine calibration circuit. The coarse calibration circuit may comprise a programmable voltage divider circuit. In some embodiments, the coarse calibration circuit is operable to adjust back gate bias voltages applied to one or more transistors in an input stage of the differential amplifier. The fine calibration circuit may comprise a programmable impedance circuit. In some embodiments, the fine calibration circuit is operable to adjust impedance values of one or more transistors in an input stage of the differential amplifier.

The control circuit may be operable to generate a test programming value at a beginning portion of a given test stage and to select a final programming value at an end portion of the given test stage. A selected delay period may separate periods during a given test stage when the test programming value is generated and when the final programming value is selected. In some embodiments, the control circuit progressively narrows the range of possible programming value sets in accordance with a binary search. In these embodiments, the control circuit may progressively narrow the range of possible programming value sets by selecting one value of the final programming value set during each test stage. The values of the final programming value set may be selected in order from most significant bit to least significant bit.

The invention also features a method of calibrating offset error in a differential amplifier.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
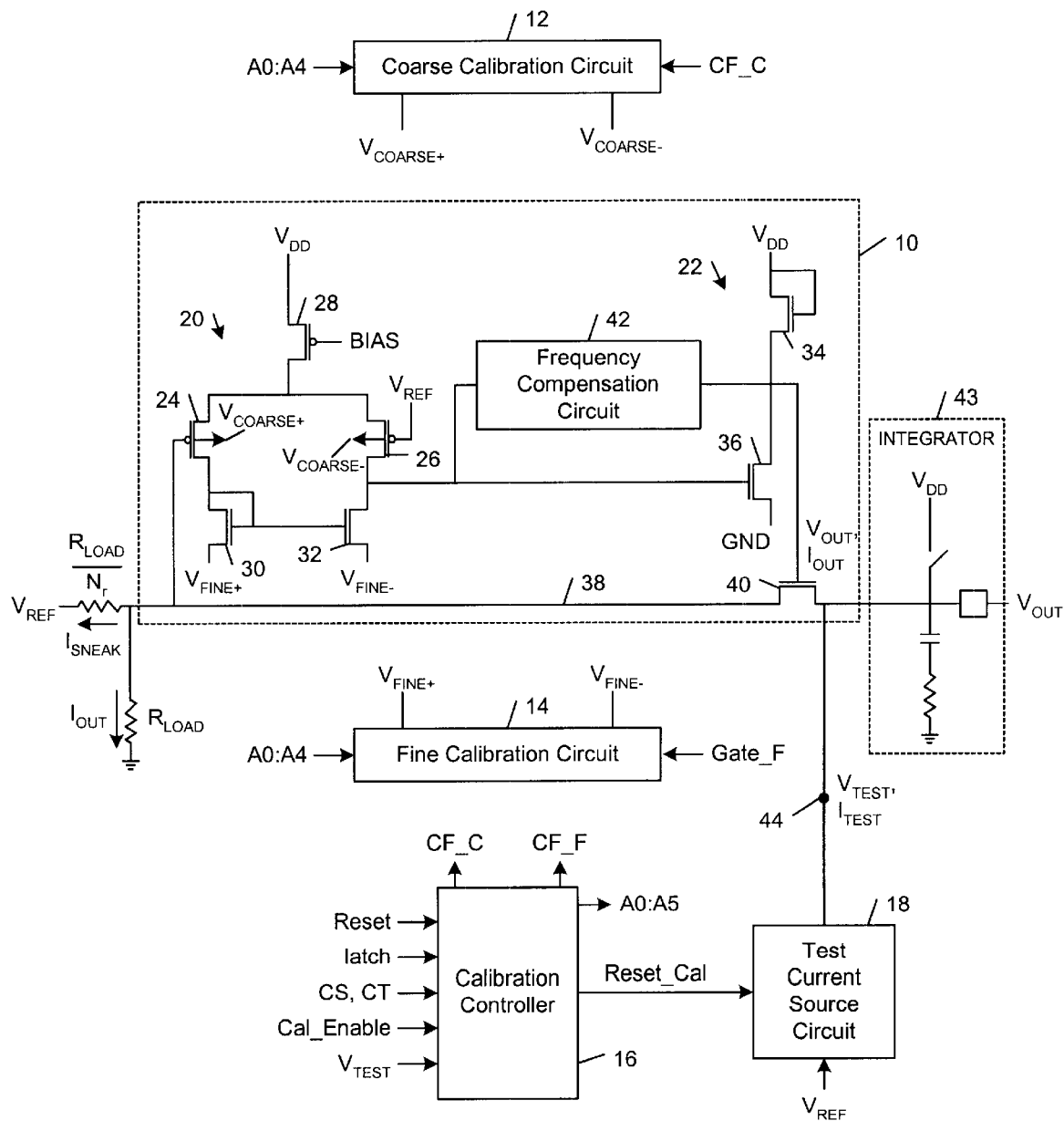
FIG. 1 is a circuit diagram of a calibration circuit that includes a coarse calibration circuit, a fine calibration circuit, a calibration controller and a test current source circuit for calibrating offset error in a differential amplifier.

Referring to FIG. 1, in one embodiment, a differential amplifier 10 may be calibrated by an offset error calibration circuit that includes a coarse calibration circuit 12 and a fine calibration circuit 14. A calibration controller 16 includes global and local control circuits for controlling the coarse calibration circuit 12 and the fine calibration circuit 14. The calibration controller 16 controls the coarse and fine calibration circuits based in part upon the values of sensed output signals ($V_{TEST}$) that are generated by differential amplifier 10 in response to test signals ($I_{TEST}$) that are applied by a test current source circuit 18. Calibration controller 16 may be implemented as an on-chip state machine or an off-chip controller. As explained in detail below, calibration controller 16 is operable to calibrate differential amplifier 10 automatically in accordance with an efficient, nonlinear offset calibration process.

Differential amplifier 10 may be implemented in any one of a wide variety of different differential amplifier circuits, including a direct injection charge amplifier, a unity gain amplifier, and a transimpedance amplifier. In the illustrated embodiment, differential amplifier 10 is implemented as a direct injection charge operational amplifier that is configured, for example, to sense memory states of a resistive cross point array of magnetic random access memory (MRAM) elements. The coarse and fine calibration circuits 12, 14 are particularly advantageous for such applications because they are compact and, therefore, may be formed under an MRAM array together with the sense amplifier circuits. In addition, the coarse and fine calibration circuits 12, 14 operate with a relatively small number of control and clock signals from an external controller, and they determine and hold reasonable values for offset calibration of the sense amplifier circuits. In this embodiment, differential amplifier includes an input stage 20 and an output stage 22. Input stage 20 includes a PMOS differential amplifier with first, second and third PMOS transistors 24, 26 and 28, and first and second NMOS transistors 30, 32, which provide a controlled current path. The substrate is common to the NMOS transistors 30 and 32, whereas the PMOS transistors 24 and 26 are located in isolated N-type wells that are formed in the substrate. The PMOS transistors 24, 26 may be formed by two P-type diffusions that are bridged by an oxide barrier and covered by a gate electrode, as described in U.S. Pat. No. 6,262,625, which is incorporated herein by reference. N-type diffusions in the wells are used as contacts to the wells. These N-type diffusions allow the back gate bias of the first and second PMOS transistors 24 and 26 to be controlled by voltage levels ($V_{COARSE+}$, $V_{COARSE-}$) that are set by a final set of coarse calibration programming values that is stored in registers of coarse calibration circuit 12. Arrows extending through gates of the PMOS transistors 24 and 26 schematically represent connections to the substrate in FIG. 1. Fine calibration circuit 14 is configured to adjust the impedance of NMOS transistors 30, 32 by adjusting the voltage levels ($V_{FINE+}$, $V_{FINE-}$) that are applied to the source terminals of transistors 30, 32. These voltage levels are set by a final set of fine calibration programming values that is stored in registers of fine calibration circuit 14.

The output stage 22 of differential amplifier 10 includes two transistors 34 and 36 that are operable to boost the gain of differential amplifier 10 and a current source transistor 40. A feedback loop 38 is formed between the first PMOS transistor 24 and the output stage 22. In some embodiments, a frequency compensation circuit 42 may be incorporated into feedback loop 38 to control the stability of the output stage 22 by reducing the high frequency gain of output stage 22. The frequency compensation circuit 42 may be a conventional frequency compensation circuit (e.g., a resistor-capacitor frequency compensation circuit similar to the one described in U.S. Pat. No. 6,262,625). Feedback loop 38 also includes a current source transistor 40, which has a gate that is coupled to an output of the frequency compensation circuit 42 and a drain-source path that is coupled to the first PMOS transistor 24 of input stage 20. In operation, the output current, $I_{OUT}$, which flows in the current source transistor 40, may be adjusted to set the output voltage at node 38 to a prescribed value.

Normal operation of the differential amplifier 10 will control an output voltage on node 38 to a level equal to the applied reference voltage $V_{REF}$. An output current $I_{OUT}$ will flow through a resistive element attached to node 38 equal to $V_{REF}/R_{LOAD}$. In the illustrated embodiment, node 38 corresponds to the selected bitline of a resistive cross point memory and $R_{LOAD}$ corresponds to the effective resistance of a selected memory cell. The voltage difference between $V_{REF}$ and the voltage applied by the differential amplifier 10 onto node 38 is defined as the amplifier's error voltage. In large resistive cross point memory arrays (where $N_r$=number of rows), error voltages on the order of 100 to 200 microvolts may cause excessive levels of "sneak currents" to flow through the unselected rows (where $I_{SNEAK}$='error voltage'/($R_{LOAD}/N_r$)) and cause a sense amplifier that incorporates differential amplifier 10 to be unable to reliably sense selected memory elements. The calibration circuits included with differential amplifier 10 are operable to adjust the offset parameters of differential amplifier 10 to reduce the amplifier error voltage to acceptably low levels (0 to 50 $\mu$V). In the illustrated embodiment, the output current $I_{OUT}$ is applied to an integration circuit 43 to form a complete sense amplifier for the resistive cross point memory.

During calibration, the test current source circuit 18 supplies a test current ($I_{TEST}$) to a test node 44 in response to a reset calibration signal (Reset_Cal) that is received from calibration controller 16. The magnitude of the test signal current may be set to substantially correspond to the value of the expected output signal current ($I_{OUT}$) in the absence of offset error. The calibration signals $V_{COARSE+}$, $V_{COARSE-}$, $V_{FINE+}$, and $V_{FINE-}$ that are applied by the coarse and fine calibration circuits 12, 14 are set in accordance with respective nonlinear search processes. The final values for the calibration signals $V_{COARSE+}$, $V_{COARSE-}$, $V_{FINE+}$, and $V_{FINE-}$ are selected based in part upon the value of the test voltage $V_{TEST}$ that is sensed at test node 44. In particular, each time a different register address is applied to either the coarse calibration circuit 12 or the fine calibration circuit 14, the levels of the coarse calibration signals $V_{COARSE+}$, $V_{COARSE-}$ or the fine calibration signals $V_{FINE+}$, and $V_{FINE-}$ are changed. When the test current $I_{TEST}$ is greater than the output current $I_{OUT}$ of differential amplifier 10, the voltage $V_{TEST}$ produced at the test node 44 is pulled high. Similarly, when the test current $I_{TEST}$ is less than the output current $I_{OUT}$ of differential amplifier 10, the voltage $V_{TEST}$ produced at the test node 44 is pulled low. During calibration, the range of possible calibration register values is narrowed progressively based upon the sensed values of the test voltage $V_{TEST}$ until a final set of optimal programming (or register) values is obtained. The stored register values set the final values of the coarse calibration signals $V_{COARSE+}$, $V_{COARSE-}$, which set the back gate bias levels of transistors 24, 26, and the final values of the fine calibration signals $V_{FINE+}$, and $V_{FINE-}$, which set the impedance levels of transistors 30, 32.

Figure 2A:
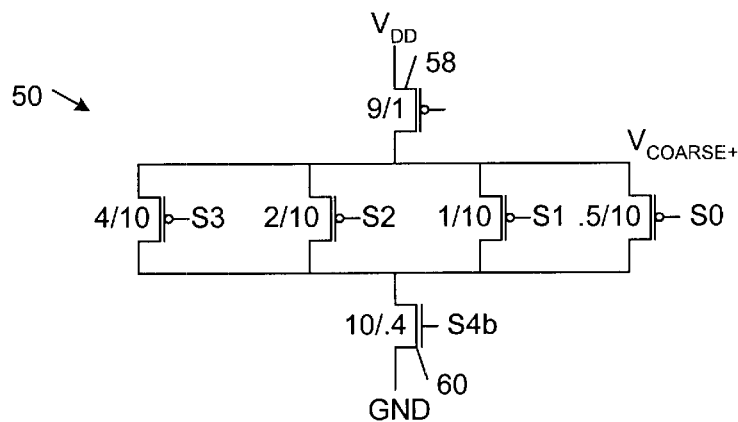
FIGS. 2A and 2B are circuit diagrams of a pair of programmable voltage divider circuits of the coarse calibration circuit of FIG. 1.
Figure 2B:
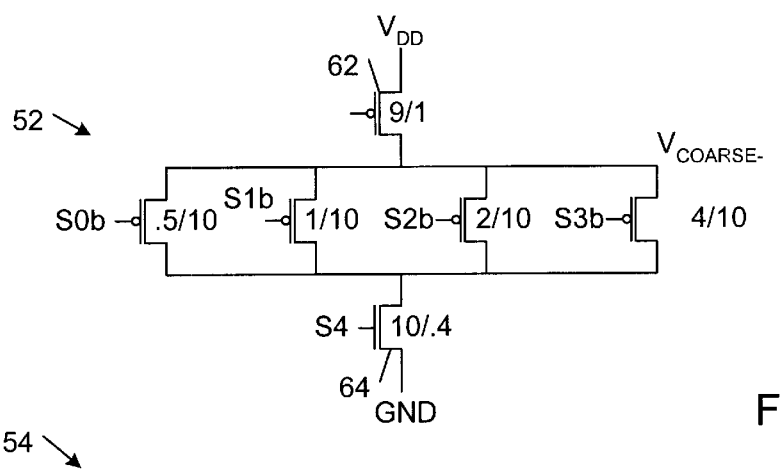
Figure 2C:
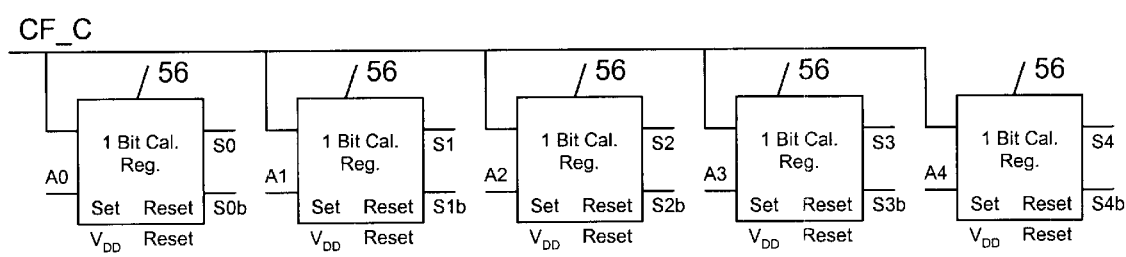
FIG. 2C is a circuit diagram of a set of programmable 1-bit registers storing programming values for the voltage divider circuits of FIGS. 2A and 2B.

Referring to FIGS. 2A, 2B and 2C, in one embodiment, coarse calibration circuit 12 includes a pair of programmable voltage dividers 50, 52 that are configured to develop the back gate bias voltages $V_{COARSE+}$, $V_{COARSE-}$ for the isolation wells of the PMOS transistors 24, 26. Each voltage divider 50, 52 is connected between a source of operating potential ($V_{DD}$) and a reference potential (GND). Each voltage divider 50, 52 includes respective upper and lower transistors 58, 60 and 62, 64, and four intermediate transistors having different source-drain path resistances. The ratio w/l that is associated with each of the transistors of the voltage divider circuits 50, 52 corresponds to the width-to-length ratio of the associated transistor. The transistor size variations set the voltage divider ratios. The coarse calibration signals $V_{COARSE+}$, $V_{COARSE-}$ may be set to as many as $2^5$ (or 32) different values over a voltage range between $V_{DD}$ and GND by turning on different sets of intermediate transistors with control signals S0:S4 and S0b:S4b. Coarse calibration circuit 12 also includes a set 54 of five 1-bit calibration registers 56. The control signals S0:S3 and S0b:S3b are set by four of the 1-bit registers 56 of set 54. The fifth 1-bit register 56 sets the voltage applied to the gates of the lower transistors 60, 64 of voltage dividers 50, 52 to control whether positive or negative offset correction is performed. The use of registers, as opposed to single-shot flip-flops, for example, avoids calibration errors that otherwise might be caused by spurious noise events. Although the coarse calibration circuit in the illustrated embodiment is programmable with five bits, other embodiments may be programmable to a greater or lesser number of bits depending upon the desired level of calibration granularity and other desired performance considerations.

Figure 3A:
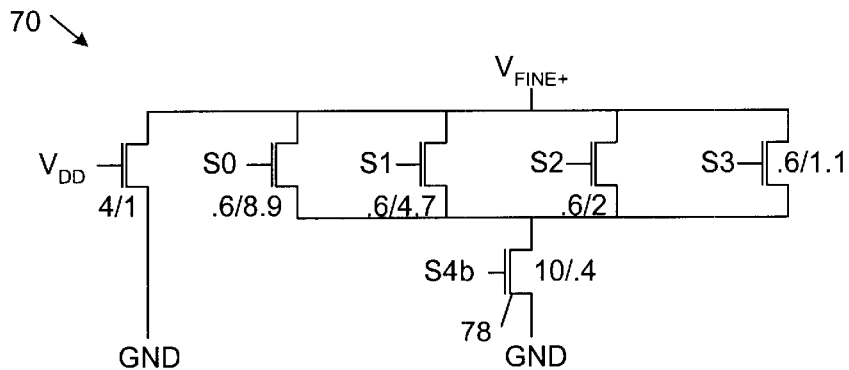
FIGS. 3A and 3B are circuit diagrams of a pair of programmable impedance circuits of the fine calibration circuit of FIG. 1.
Figure 3B:
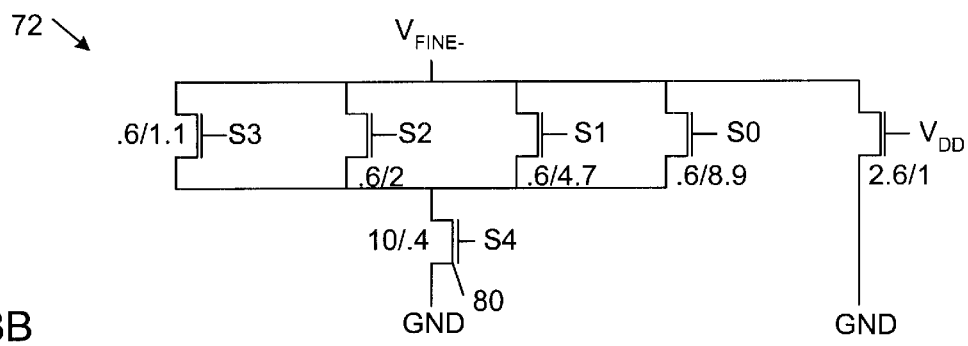
Figure 3C:
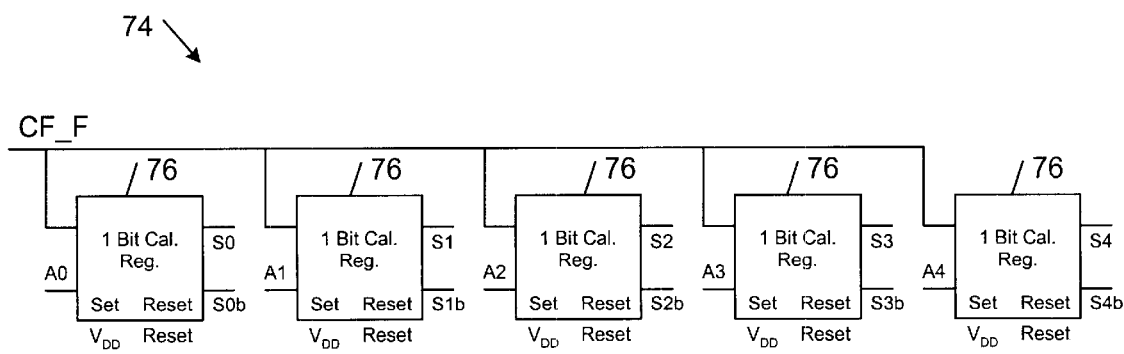
FIG. 3C is a circuit diagram of a set of programmable 1-bit registers storing programming values for the impedance circuits of FIGS. 3A and 3B.

Referring to FIGS. 3A, 3B and 3C, in one embodiment, fine calibration circuit 14 includes a pair of programmable impedance circuits 70, 72 that are configured to develop fine calibration signals $V_{FINE+}$, and $V_{FINE-}$, which set the impedance levels of transistors 30, 32. Programmable impedance circuits 70, 72 respectively combine with first and second NMOS transistors 30, 32 to form a pair of current mirror circuits. Each programmable impedance circuit 70, 72 includes respective lower transistors 78, 80, and four intermediate transistors having different source-drain path resistances. The ratio w/l that is associated with each of the transistors of the programmable circuits 70, 72 corresponds to the width-to-length ratio of the associated transistor. The transistor size variations set the impedance ratios. The fine calibration signals $V_{FINE+}$, and $V_{FINE-}$ and, consequently the impedance levels in the pair of current mirrors, may be set to as many as $2^5$ (or 32) different values by turning on different sets of intermediate transistors with control signals S0:S4 and S4b. Fine calibration circuit 14 also includes a set 74 of five 1-bit calibration registers 76. The control signals S0:S3 are set by four of the 1-bit registers 76 of set 74. The fifth 1-bit register 76 sets the voltage applied to the gates of the lower transistors 78, 80 of impedance circuits 70, 72 to control whether positive or negative offset correction is performed. The use of registers, as opposed to single-shot flip-flops, for example, avoids calibration errors that otherwise might be caused by spurious noise events. Although the fine calibration circuit in the illustrated embodiment is programmable with five bits, other embodiments may be programmable to a greater or lesser number of bits depending upon the desired level of calibration granularity and other desired performance considerations.

Figure 4A:
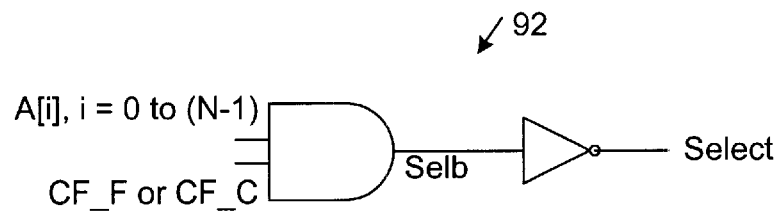
FIG. 4A is a decoder circuit of a 1-bit register.
Figure 4B:
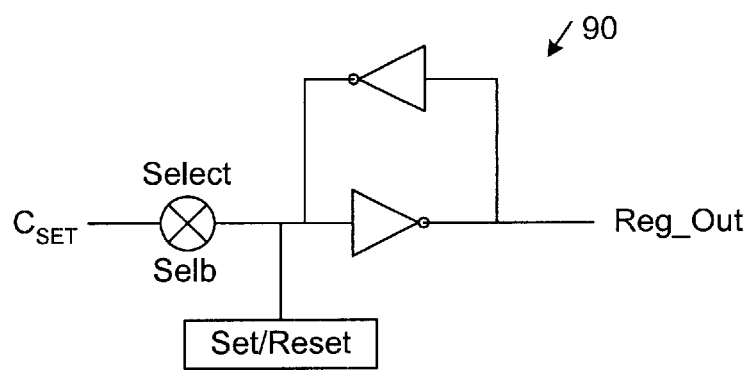
FIG. 4B is a latch of a 1-bit register.

Referring to FIGS. 4A and 4B, in one embodiment, each of the 1-bit registers 56 and 76 of coarse and fine calibration circuits 12, 14 may be implemented by a weak-feedback latch 90 with an input controlled by the output of a NAND gate decoder 92. Global select signals A[i] and CF_C and CF_F are used to control the gate of each calibration register. An input signal $C_{SET}$ is developed by a local control circuit (which is described below in connection with FIGS. 5A and 5B) and is applied to the input of latch 90. As described in detail below, the value of $C_{SET}$ is set by the state of the global select signal A[i] at the beginning of each test period and is reset to a value that is dependent on the value of the test signal ($V_{TEST}$) at the end of each test period.

Figure 5:
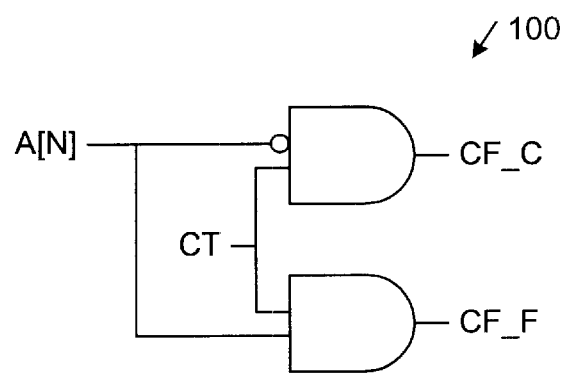
FIG. 5 is a logic circuit for providing a pair of global select signals to the coarse and fine calibration circuits of FIG. 1.

As shown in FIG. 5, a global coarse/fine calibration select circuit 100 is configured to transmit calibration circuit select signals (CF_C and CF_F) to coarse calibration circuit 12 and fine calibration circuit 14 based upon the value of the most significant register address bit A[N] (N=5 in the illustrated embodiment) and the value of clock signal CT. In particular, coarse calibration circuit 12 is selected (i.e., CF_C is set high) when the most significant register address bit A[N] is low and CT is pulsed high. Fine calibration circuit 14 is selected (i.e., CF_F is set high) when the most significant register address bit A[N] is high and CT is pulsed high.

Figure 6:
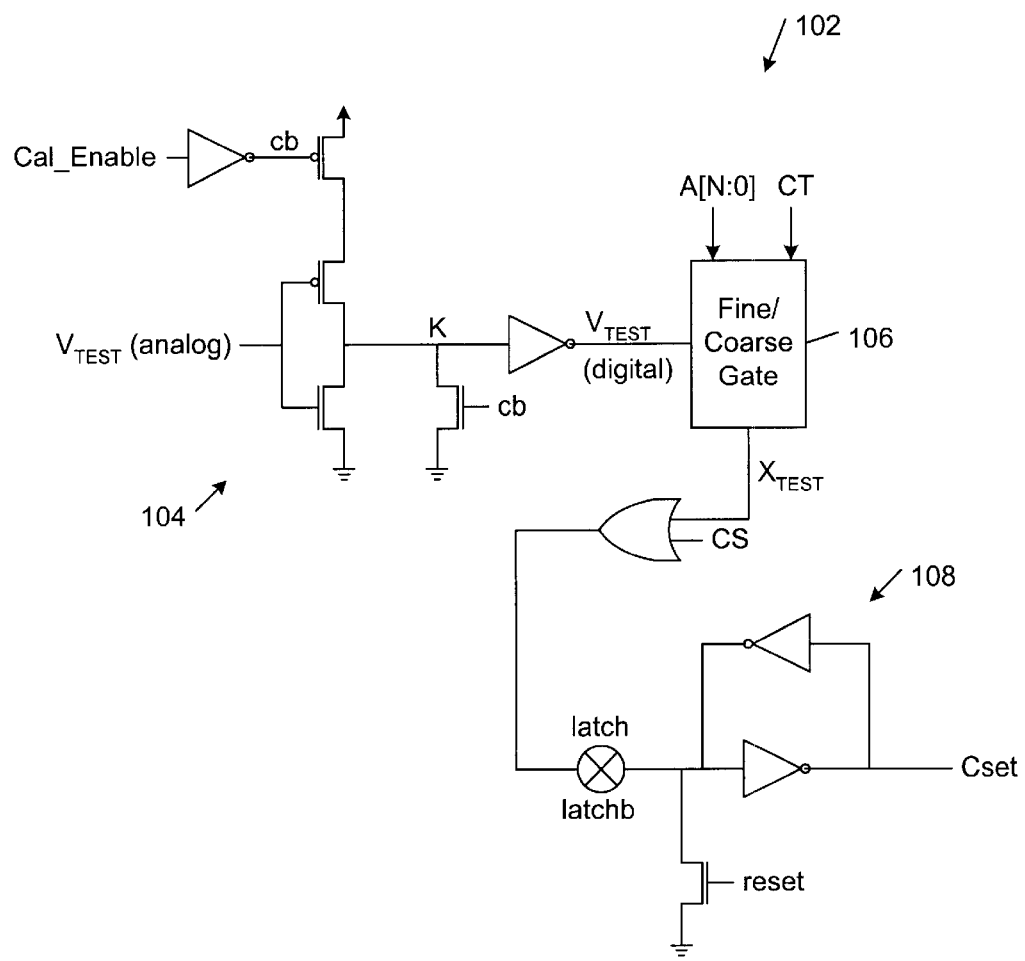
FIG. 6 is a circuit diagram of a local control circuit for programming values into the registers of the coarse and fine calibration circuits of FIG. 1.
Figure 7:
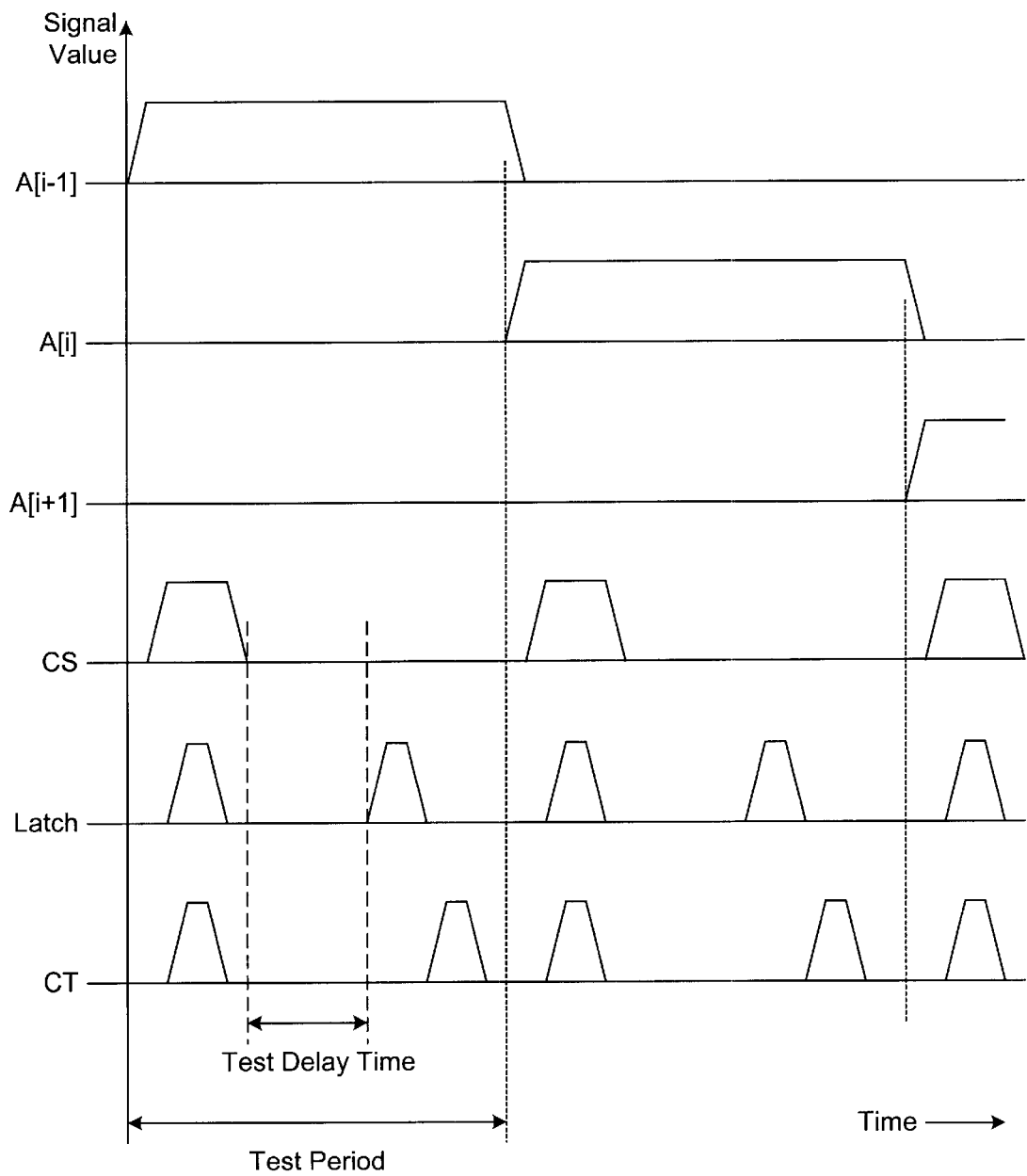
FIG. 7 is a graph of global control signal values plotted as a function of time.

Referring to FIGS. 6 and 7, each of the coarse and fine calibration circuits 12, 14 is controlled by a respective local control circuit 102 that is responsive to a set of global control signals, including a set of calibration register select addresses A[N:0] and three clock signals (CS, CT and latch). Local control circuit 102 includes a receiver circuit 104, a fine/coarse gate circuit 106, and a test signal data register 108. The receiver circuit 104 converts the large swing analog signal $V_{TEST}$ to a digital signal $V_{TEST}$ (digital) when the calibration enable signal (Cal_Enable) is asserted. When the calibration enable signal is low, the receiver circuit 104 is disabled and an internal node K is pulled low. The fine/coarse gate circuit 106 develops a logic signal $X_{TEST}$ based upon the test signal $V_{TEST}$ (digital) and the respective requirements of the coarse and fine calibration circuits 12, 14. In particular, fine/coarse gate circuit 106 develops a similar logic signal $X_{TEST}$ for both the coarse and fine calibrations; however, fine/coarse gate circuit 106 is configured to accommodate the inversion of the test signal that occurs when switching from the $V_{FINE+}$ fine calibration test to the $V_{FINE-}$ fine calibration test. The test signal data register 108 is set high at the beginning of each test period when CS is pulsed high and is set to the value of $X_{TEST}$ at the end of each test period. A latch signal is pulsed to store either CS or $X_{TEST}$ in the test signal data register 108. As shown in FIG. 7, when the CS, latch, and CT signals are pulsed high at the beginning of a test period, one of the 2(N−1) coarse and fine calibration registers is selected and set high. A particular calibration register is selected when its corresponding calibration circuit is enabled (by CF_C or CF_F) and its corresponding register address A[i] is high. At the end of a test period, the test signal $V_{TEST}$ is processed through the receiver circuit 104 and the fine/coarse gate 106 to supply the test signal $X_{TEST}$ to the input of the test signal data register 108. The latch signal is pulsed to store the value of $X_{TEST}$ in the test signal data register 108, which has an output value Cset. Subsequently, the CT signal is pulsed high to store the value of Cset in the selected calibration register.

Figure 8A:
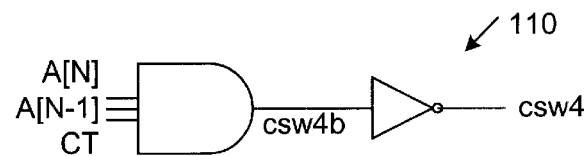
FIGS. 8A, 8B and 8C are circuit diagrams of components of a coarse/fine select circuit of the local control circuit of FIG. 6
Figure 8B:
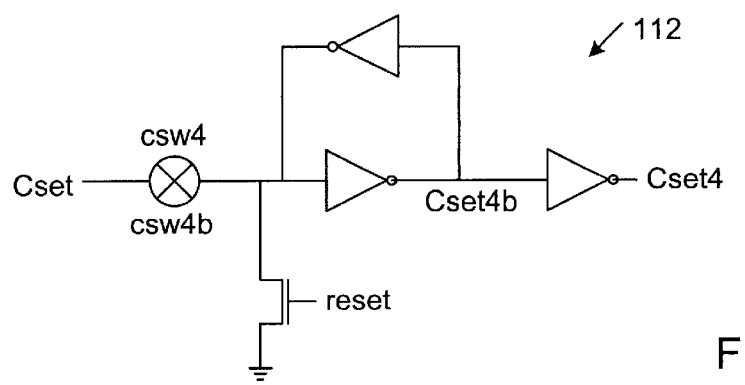
Figure 8C:
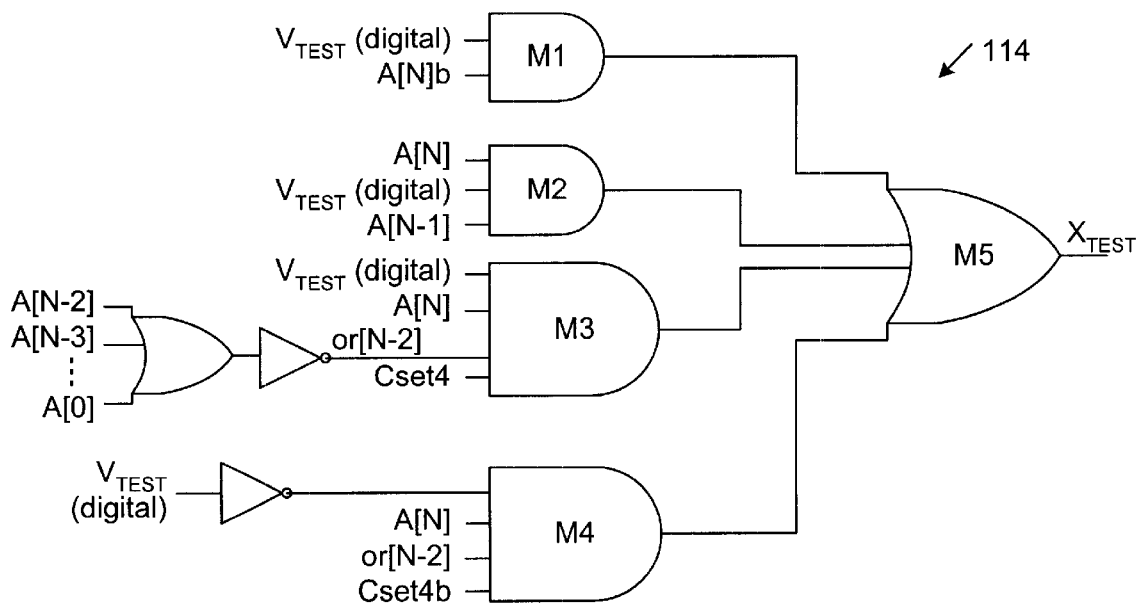

Referring to FIGS. 8A, 8B and 8C, in one embodiment, the fine/coarse gate circuit 106 may be implemented with conventional combinatorial logic gates and a latch. In particular, the fine/coarse gate circuit 106 includes a NAND gate 110 that sets transmission gate control signals csw4, csw4b for a weak-feedback latch 112 with an input coupled to the output of test signal data register 108. Fine/coarse gate circuit 106 also includes logic gate circuitry 114 that controls the value of the test logic signal $X_{TEST}$ based upon the value of the digital test signal $V_{TEST}$ (digital), the register addresses A[N:0] and the values at the outputs (Cset4, Cset4b) of latch 112. In operation, coarse calibration is performed when A[N] is set low. In this case, gate M1 is selected, gates M2, M3 and M4 are deselected, and the signal $V_{TEST}$ (digital) passes through the gate without inversion. Fine calibration is performed when A[N] is set high. In this case, the state of Cset is stored in latch 112 as Cset4 when testing the most significant bit (A[N−1]) of the fine calibration circuit. Cset4 is set high when the $V_{FINE+}$ calibration values are being set and Cset4 is low when the $V_{FINE-}$ calibration values are being set. The digital test signal $V_{TEST}$ (digital) passes through gate M2 without inversion when setting the most significant bits (A[N−1]) of the fine calibration circuits. The digital test signal $V_{TEST}$ (digital) passes through gate M3 also without inversion when setting the remaining bits (A[N−2:0]) of the $V_{FINE+}$ portion of the fine calibration circuit. The digital test signal $V_{TEST}$ (digital), however, passes through gate M4 with inversion when setting the remaining bits (A[N−2:0]) of the $V_{FINE-}$ portion of the fine calibration circuit. Additional details regarding the operation of the fine/coarse gate circuit 106 are explained below in connection with FIGS. 9A and 9B.

Figure 9A:
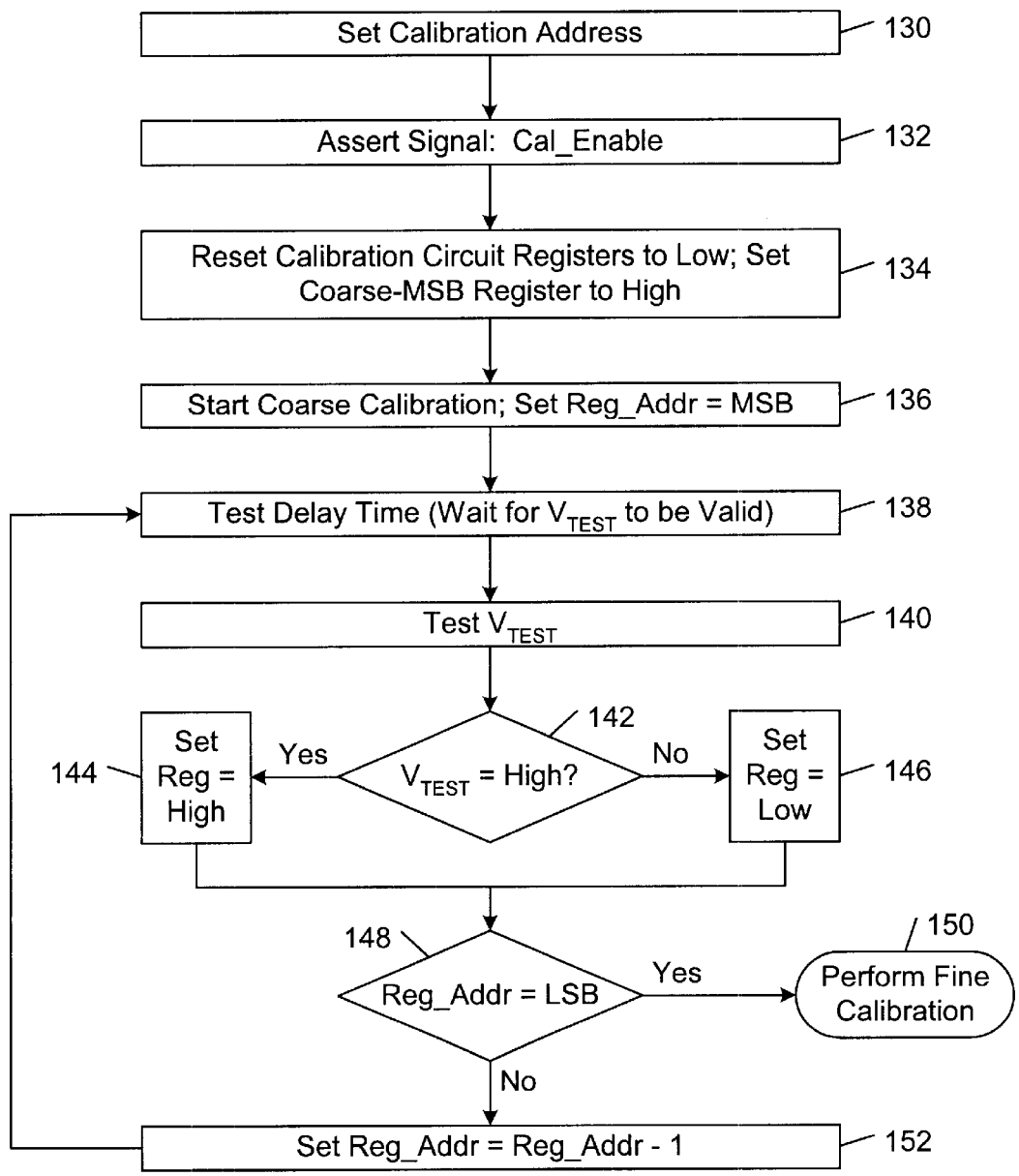
FIG. 9A is a flow diagram of a coarse offset calibration method.
Figure 9B:
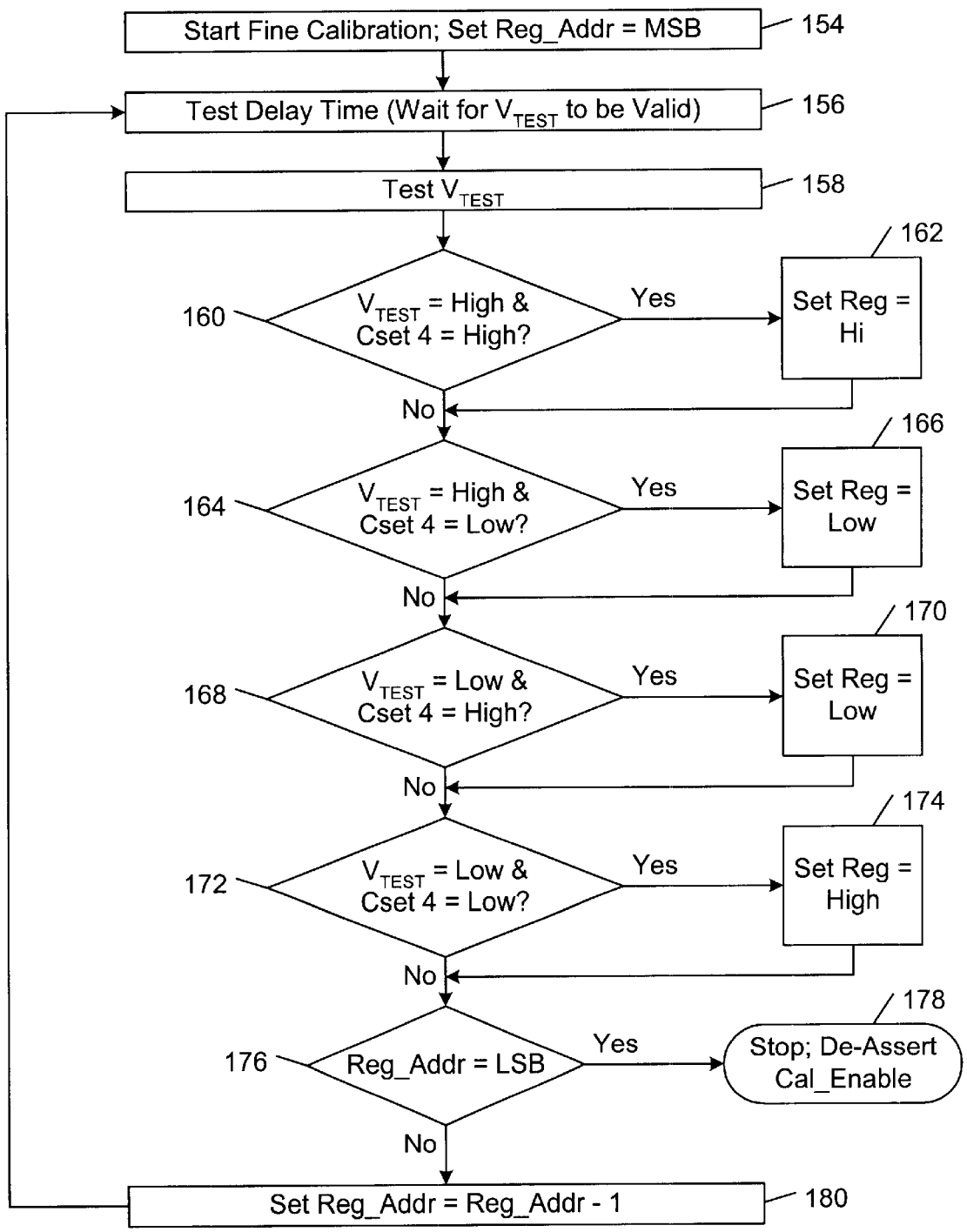
FIG. 9B is a flow diagram of a fine offset calibration method.

Referring to FIGS. 9A and 9B, in one embodiment, differential amplifier 10 may be calibrated in accordance with a binary search calibration process as follows. Initially, a calibration address is set (step 130) and the calibration enable signal (Cal_Enable) is asserted (step 132). The calibration circuit registers are reset to low and the most significant bit (A[N−1]) for coarse calibration circuit 12 is set high (step 134). At the beginning of the coarse calibration process, the selected register address (Reg_Addr) is set to the most significant bit (step 136). By starting the coarse calibration at the most significant bit (i.e., at test vector [A(4), A(3), A(2), A(1), A(0)]=[1, 0, 0, 0, 0]), coarse calibration circuit 12 is able to determine whether the optimal calibration programming value setting lies in the upper half of the register programming value range or in the lower half of the register programming value range. After a test delay time (step 138), the test signal $V_{TEST}$ is tested (step 140). If $V_{TEST}$ is high (step 142), $I_{TEST}>I_{OUT}$ and the optimal calibration address setting must lie in the upper half of the register programming value range. Accordingly, the calibration register corresponding to Reg_Addr is set high (step 144). If $V_{TEST}$ is low (step 142), $I_{TEST}<I_{OUT}$ and the optimal calibration address setting must lie in the lower half of the register programming value range, in which case the calibration register is set low (step 146). If the selected register corresponds to the least significant bit (i.e., Reg_Addr=LSB) (step 148), the fine calibration process is performed (step 150). Otherwise, Reg_Addr is decremented by 1 (step 152) and the binary search calibration process is repeated for each bit of the coarse calibration circuit 12 until the least significant bit is calibrated (steps 138–152). After the least significant bit for the coarse calibration is calibrated, the address bit A[N] (A[5] in this embodiment) is changed from a '0' to a '1' to switch from the coarse calibration circuits to the fine calibration circuits.

At the beginning of the fine calibration process, the selected register address (Reg_Addr) is set to the most significant bit (step 154). By starting the fine calibration at the most significant bit (i.e., at test vector [A(4), A(3), A(2), A(1), A(0)]=[1, 0, 0, 0, 0]), fine calibration circuit 14 is able to determine whether the optimal calibration programming value setting lies in the upper half of the register programming value range or in the lower half of the register programming value range. After a test delay time (step 156), the test signal $V_{TEST}$ is tested (step 158). In general, the selected calibration register is set to a value that tracks $V_{TEST}$ if Cset4 is high (i.e., when the $V_{FINE+}$ calibration values are being set), whereas the selected calibration register is set to the inverse of $V_{TEST}$ if Cset4 is low (i.e., when the $V_{FINE-}$ calibration values are being set). Thus, if $V_{TEST}$ is high and Cset4 is high (step 160), the calibration register corresponding to Reg_Addr is set high (step 162). If $V_{TEST}$ is high and Cset4 is low (step 164), the calibration register corresponding to Reg_Addr is set low (step 166). If $V_{TEST}$ is low and Cset4 is high (step 168), the calibration register corresponding to Reg_Addr is set low (step 170). If $V_{TEST}$ is low and Cset4 is low (step 172), the calibration register corresponding to Reg_Addr is set high (step 174). If the selected register corresponds to the least significant bit (i.e., Reg_Addr=LSB) (step 176), the calibration process is terminated and the calibration enable signal (Cal_Enable) is deasserted (step 178). Otherwise, Reg_Addr is decremented by 1 (step 180) and the process is repeated for each bit of the fine calibration circuit 14 (steps 156–180).

In general, the binary calibration process requires only 2(N−1) test periods, as opposed to the relatively large number of test periods ($2^N$) required by linear search calibration techniques. As a result, longer test periods may be used with the above-described calibration process without adversely affecting the overall length of the calibration process. Because circuit conditions near the calibration point cause internal test signals to switch more slowly from one state to another, lengthening the test period time may allow more time for the internal test signals to reach their final values and, thereby, improve calibration accuracy.

Other embodiments are within the scope of the claims.

Some embodiments may employ other, non-binary non-linear calibration search methods. For example, the range of programming values may be narrowed at the outset of a calibration cycle based upon one or more prior calibrations (i.e., the calibration history) of differential amplifier 10. Alternatively, a weighted search methodology may be used. For example, the real time value of the test signal $V_{TEST}$ may be used to narrow the range of programming values during calibration.

Still other embodiments are within the scope of the claims.

What is claimed is:

1. A circuit for calibrating offset error in a differential amplifier, comprising:
    a memory circuit operable to store a set of programming values selected from a range of multiple possible sets of programming values;
    an output circuit coupled to the memory circuit and operable to place the differential amplifier in a selected calibrated state by applying to the differential amplifier an output calibration signal generated based upon the set of programming values stored in the memory circuit; and
    a control circuit coupled to the memory circuit and operable to program the memory circuit with a final set of programming values by progressively narrowing the range of possible programming value sets until the final set of programming values is obtained, the range of possible programming value sets being progressively narrowed in test stages in accordance with a nonlinear search, wherein at each test stage a set of programming values is selected based upon a sensed differential amplifier signal generated in response to a test signal applied to the differential amplifier in a selected calibrated state.

2. The calibration circuit of claim 1, wherein the memory circuit comprises a set of calibration registers.

3. The calibration circuit of claim 2, wherein each calibration register is gated by a set of global select signals.

4. The calibration circuit of claim 2, wherein each calibration register is settable and re-settable.

5. The calibration circuit of claim 1, wherein the output circuit comprises a coarse calibration circuit and a fine calibration circuit.

6. The calibration circuit of claim 5, wherein the coarse calibration circuit comprises a programmable voltage divider circuit.

7. The calibration circuit of claim 5, wherein the coarse calibration circuit is operable to adjust back gate bias voltages applied to one or more transistors in an input stage of the differential amplifier.

8. The calibration circuit of claim 5, wherein the fine calibration circuit comprises a programmable impedance circuit.

9. The calibration circuit of claim 5, wherein the fine calibration circuit is operable to adjust impedance values of one or more transistors in an input stage of the differential amplifier.

10. The calibration circuit of claim 1, wherein the control circuit is operable to generate a test programming value at a beginning portion of a given test stage and to select a final programming value at an end portion of the given test stage.

11. The calibration circuit of claim 10, wherein a selected delay period separates periods during a given test stage when the test programming value is generated and when the final programming value is selected.

12. The calibration circuit of claim 1, wherein the control circuit progressively narrows the range of possible programming value sets in accordance with a binary search.

13. The calibration circuit of claim 12, wherein the control circuit progressively narrows the range of possible programming value sets by selecting one value of the final programming value set during each test stage.

14. The calibration circuit of claim 13, wherein the values of the final programming value set are selected in order from most significant bit to least significant bit.

15. A method of calibrating offset error in a differential amplifier, comprising:
    storing in a memory circuit a set of programming values selected from a range of multiple possible sets of programming values;
    placing the differential amplifier in a selected calibrated state by applying to the differential amplifier an output calibration signal generated based upon the set of programming values stored in the memory circuit; and
    programming the memory circuit with a final set of programming values by progressively narrowing the range of possible programming value sets until the final set of programming values is obtained, the range of possible programming value sets being progressively narrowed in test stages in accordance with a nonlinear search, wherein at each test stage a set of programming values is selected based upon a sensed differential amplifier signal generated in response to a test signal applied to the differential amplifier in a selected calibrated state.

16. The calibration method of claim 15, further comprising generating a test programming value at a beginning portion of a given test stage and to selecting a final programming value at an end portion of the given test stage.

17. The calibration method of claim 16, wherein a selected delay period separates when the test programming value is generated and when the final programming value is selected during a given test stage.

18. The calibration method of claim 15, wherein the range of possible programming value sets is progressively narrowed in accordance with a binary search.

19. The calibration method of claim 18, wherein the range of possible programming value sets is progressively narrowed by selecting one value of the final programming value set during each test stage.

20. The calibration method of claim 19, wherein the values of the final programming value set are selected in order from most significant bit to least significant bit.

* * * * *